United States Patent
Auch et al.

(10) Patent No.: US 6,803,245 B2
(45) Date of Patent: Oct. 12, 2004

(54) PROCEDURE FOR ENCAPSULATION OF ELECTRONIC DEVICES

(75) Inventors: Mark Auch, Singapore (SG); Ewald Guenther, Singapore (SG); Chua Soo Jin, Singapore (SG)

(73) Assignees: Osram Opto Semiconductors GmbH, Regensburg (DE); Institute of Materials Research and Engineering, Singapore (SG)

( * ) Notice: Subject to any disclaimer, the term of this patent is extended or adjusted under 35 U.S.C. 154(b) by 245 days.

(21) Appl. No.: 09/968,567

(22) Filed: Sep. 28, 2001

(65) Prior Publication Data

US 2003/0064540 A1 Apr. 3, 2003

(51) Int. Cl.⁷ .............................................. H01L 21/00
(52) U.S. Cl. ........................ 438/26; 438/99; 438/116; 438/118
(58) Field of Search .......................... 438/26, 99, 106, 438/116, 118

(56) References Cited

U.S. PATENT DOCUMENTS 6,590,157 B2 * 7/2003 Boroson et al. ............ 174/52.2
2002/0187254 A1 * 12/2002 Ghosh et al. ................. 427/58

* cited by examiner

Primary Examiner—Amir Zarabian
Assistant Examiner—Christy Novacek
(74) Attorney, Agent, or Firm—Dexter Chin

(57) ABSTRACT

An encapsulation procedure for an organic light emitting diode (OLED) device, especially for thin and therefore flexible substrates, is disclosed. The device is sealed hermetically against environmental and mechanical damage. The procedure includes the use of a thin cover lid holder and a substrate holder that are designed to handle thin substrates without damaging them. Thin substrates ensure sufficient mechanical flexibility for the OLED devices, and provides an overall thickness of less than 0.5 mm.

18 Claims, 8 Drawing Sheets

US 6,803,245 B2

PROCEDURE FOR ENCAPSULATION OF ELECTRONIC DEVICES

FIELD OF THE INVENTION

The present invention relates to organic light emitting diode (OLED) devices. More particularly, the invention relates to an encapsulation procedure for OLED devices.

BACKGROUND OF THE INVENTION

FIG. 1 shows a conventional OLED device 100. OLED devices can be used as displays in various consumer electronic products, including cellular smart phones, personal organizers, touch screen displays, multimedia equipment and virtual reality products. The basic advantages of OLED devices are low driving voltage, low power consumption, large viewing angle, high contrast, fast response, rugged design and the potential for low manufacturing costs.

The OLED device comprises a functional stack of one or more organic functional layers 110 between a transparent conductive layer 105 and a conductive layer 115. The functional stack is formed on a transparent substrate 101. The conductive layers can be patterned to form one or more cells or pixels on the substrate. In operation, charge carriers are injected through the cathodes and anodes for recombination in the functional layers. The recombination of the charge carriers causes the functional layer to emit visible radiation.

A cap 160, which forms a cavity 145 between it and the pixels, is mounted on the substrate. A sealant 187 is applied around the edges of the cap where it contacts the substrate. The cavity structure is necessary to protect the OLED layer from moisture, oxygen and other environmental influence, and to prevent mechanical interaction between the OLED layer stack and the packaging material, especially when mechanical pressure is applied from the outside.

The process of mounting the cap involves picking up the substrates, aligning the cap with the substrate, applying a sealant and pressing the substrate and cover cap together. The tools and procedures for encapsulation are designed for handling thick rigid glass (0.3–1.1 mm) or metal caps, and are not suitable for handling thin flexible substrate materials that break easily. The amount of mechanical flexibility achieved for the final product is negligible since metal caps and thick rigid glass sheets are used. These devices typically exhibit a thickness of more than 2 mm.

Thin substrate materials exhibit higher mechanical flexibility, and are suitable for small, light-weight and flexible applications. The tools and methods used for thick rigid substrates cannot be used for handling thin substrate materials without major adaptation.

As evidenced from the discussion above, it is desirable to provide an improved procedure designed for handling thin fragile substrates in the production of OLED devices.

SUMMARY OF THE INVENTION

The invention relates generally to OLED devices. In particular, the invention relates to the sealing procedure for device encapsulation, especially OLED devices on ultra thin flexible substrates.

In accordance with the invention, a substrate holder is provided to support the substrate containing the OLED active components. A cover lid is attached to a lid holder. In one embodiment of the invention, the cover lid is kept in place by adhesive tape that loses its adhesive property after a treatment process. In one embodiment, the treatment process comprises heat exposure. In another embodiment, UV radiation is used. Other types of treatment processes are also useful, depending on the adhesives used, e.g. usage of chemicals.

The lid holder is aligned with the substrate holder to place the lid on the substrate. With the use of the adhesive release tape, the fragile thin lid can be placed safely onto the substrate without breakage. In one embodiment of the invention, UV-curable sealant is dispensed on the cover lid before mounting the lid and cured by UV light after placing the lid on the substrate.

The adhesive tape used to attach the cover lid to the lid holder is treated such that it loses its adhesive property. The substrate and lid holders are then separated and the encapsulated OLED device released.

The sealing procedure produces a thin and flexible cavity structure that provides hermetic sealing against oxygen and moisture. Thin or ultra thin glass substrates can be used to provide higher mechanical flexibility than conventional thick glass substrates. The overall OLED device thickness achieved is less than 0.5 mm. The procedure is compatible with sensitive OLED materials and is scalable to cost-effective mass production.

PREFERRED EMBODIMENTS OF THE INVENTION

Figure 1:
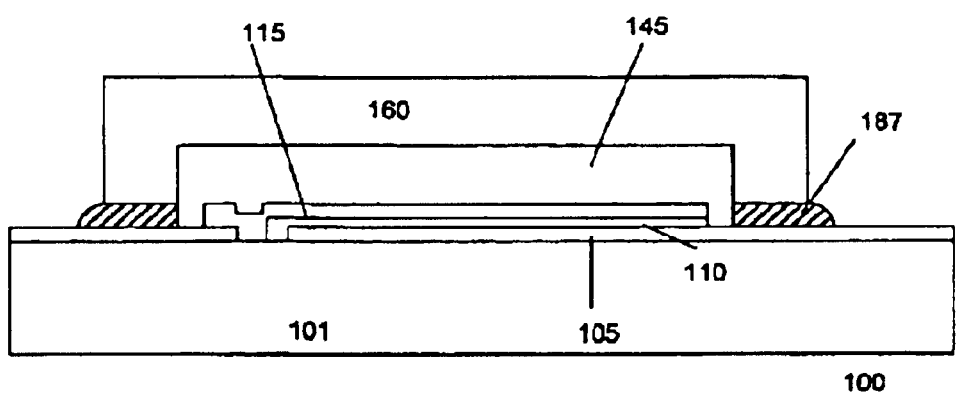
FIG. 1 shows a conventional OLED device.
Figure 2:
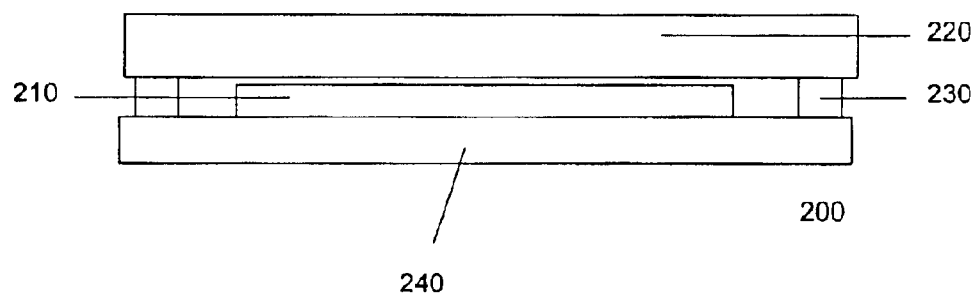
FIG. 2 shows a thin flexible OLED device.

FIG. 2 shows a thin flexible OLED device 200 according to one embodiment of the invention. The OLED device comprises a substrate 240 on which active components are formed in the device region thereof. The active components, for example, comprise OLED pixels, segments or other patterns. In one embodiment, the substrate comprises a transparent substrate, such as glass. The substrate, for example, can be made from silicate glass such as borosilicate glass. Other transparent materials, such as plastic, sodalime glass or other types of glass, are also useful. Typically, the thickness of the thin substrate is less than about 0.5 mm, preferably about 0.01–0.2 mm.

The OLED active components 210 comprise one or more organic layers sandwiched between 2 electrodes. A lid 220 is provided to encapsulate the OLED pixels. The lid layer comprises, for example, a metal or glass. Other types of cover lids, which protect the active components from the environment, such as ceramic or metallized foil, are also useful. Typically, the cover lid exhibits a thickness of 0.01 mm to 0.2 mm.

In one embodiment, adhesive 230 is used to mount the lid. Adhesives such as self-hardening adhesives, UV or thermal curable adhesives, or hot melt adhesives are useful. Other techniques that employ low temperature solder materials, ultrasonic bonding, or welding techniques using inductance or laser welding are also useful.

Figure 3:
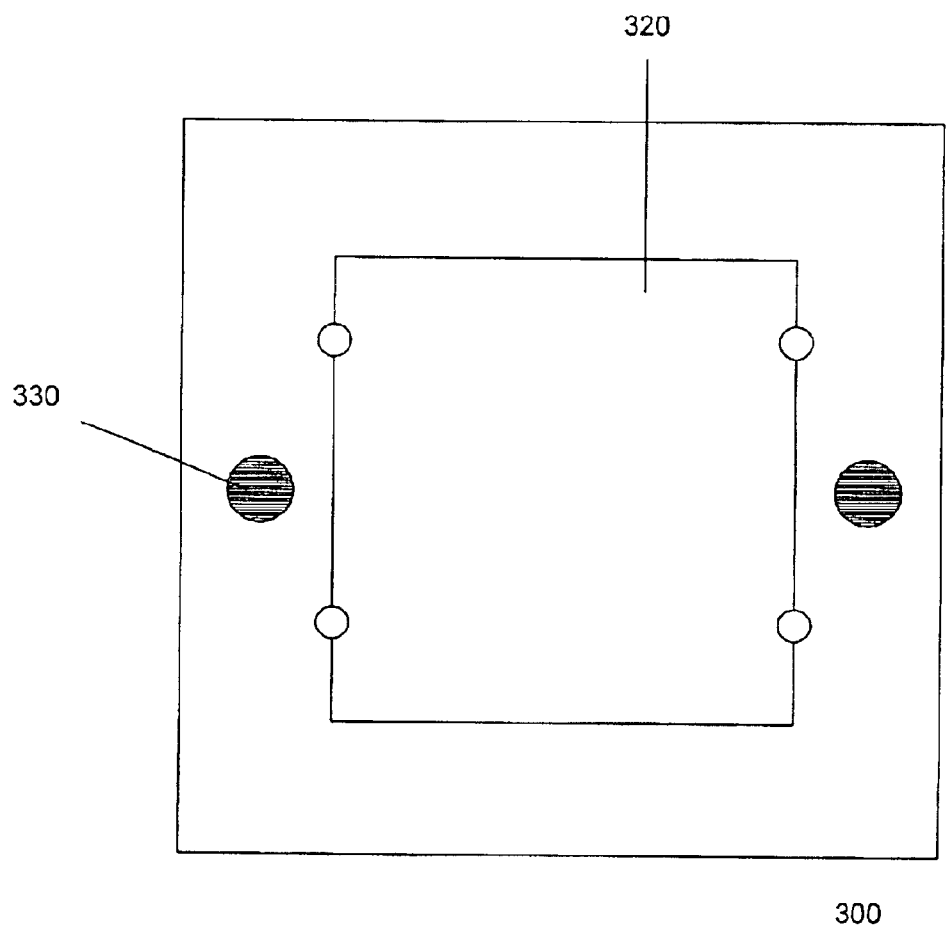
FIG. 3 shows a substrate holder.

A substrate holder and a lid holder are provided to handle the thin fragile substrate and cover lid. Referring to FIG. 3, a substrate holder 300 with alignment pillars 330 is provided. The pillars ensure precise positioning of the lid holder and the substrate holder when the lid holder is placed on the substrate holder. Other types of mechanical guides are also useful.

In one embodiment of the invention, mechanical guides are used to keep the substrate in the correct position. In FIG. 3, a cavity 320 is provided to hold and align the substrate. Alternatively, the substrate can be kept from moving out of position by a vacuum chuck. In another embodiment, an adhesive tape that loses its adhesion after some treatment (e.g. heat exposure or UV radiation) is used.

Figure 4:
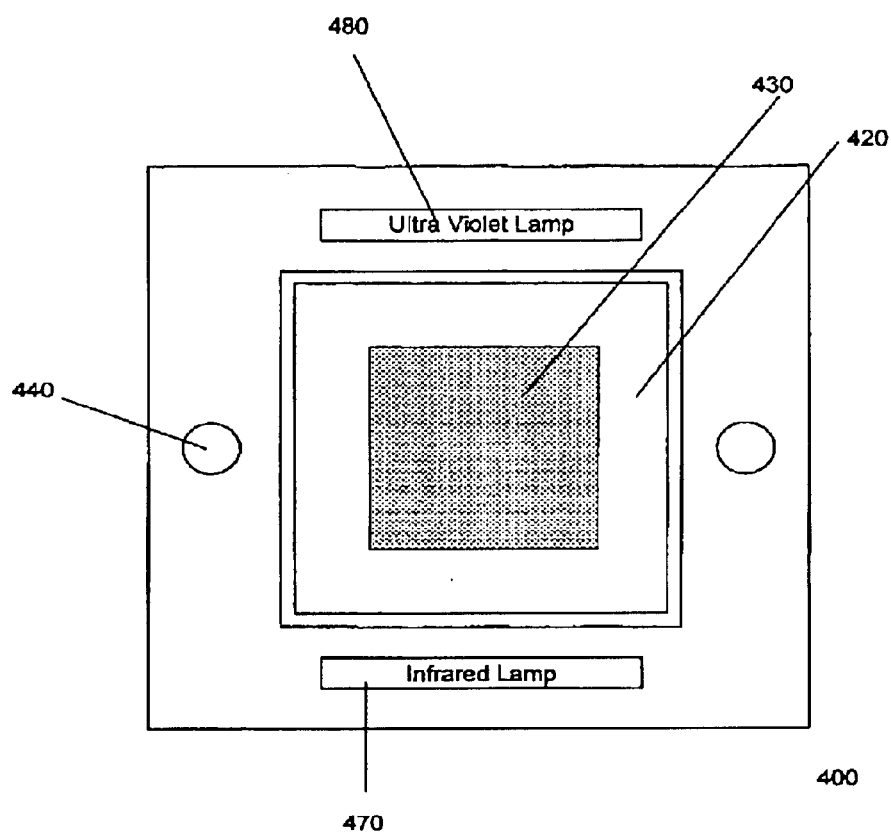
FIG. 4 shows a cover lid holder.

FIG. 4 shows a cover lid holder 400 that is used to place the thin flexible lid on the substrate. Alignment guides 440 are provided to align the lid holder with the substrate holder. In one embodiment of the invention, a glass support 420 that is transparent to UV radiation is used to cover the lid so that UV light can permeate and cure the UV-curable sealant during the sealing process. The areas where the sensitive OLEDs are located are shielded from the radiation. In another embodiment, the lid cover holder contains an ultraviolet lamp 480 for curing the UV-curable sealant. In yet another embodiment of the invention, the cover lid holder contains an infrared lamp 470 for curing a thermal-curable sealant. Alternatively, if thermal-curable sealant is used, the area above the sealant region is made transparent to infrared radiation to allow the radiation to pass through and cure the sealant.

In a preferred embodiment of the invention, a special adhesive release tape 430 that loses its adhesive property after a treatment process, such as heat exposure or UV radiation, is used to keep the lid from moving out of place. The tape can have adhesive coating either on one side or on both sides. In one embodiment, the adhesive tape is fixed to a tool, which attaches the tape to the lid. In yet another embodiment, a vacuum chuck is used to keep the lid in place.

Figure 5:
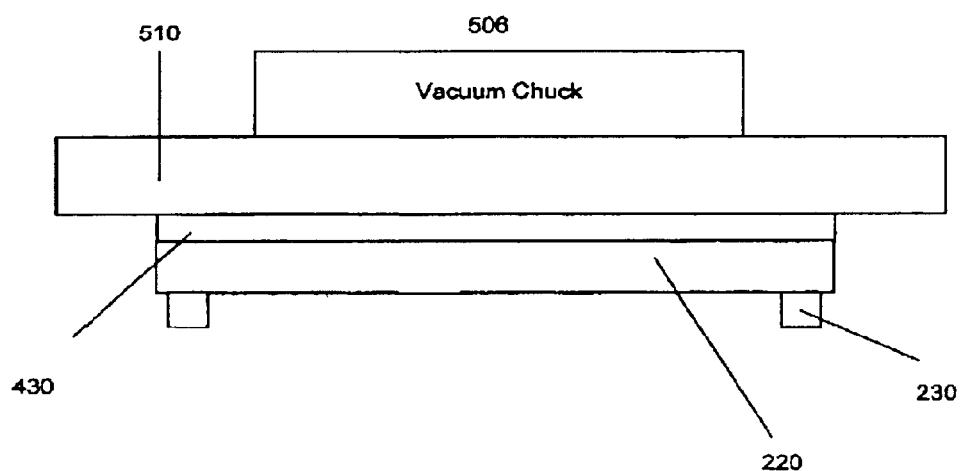
FIGS. 5–8 show a process for encapsulating an OLED device in accordance with one embodiment of the invention.

FIGS. 5–8 show a process for encapsulating the OLED device in accordance with one embodiment of the invention. Referring to FIG. 5, the thin flexible lid 220 is attached to the lid holder 510 using adhesive release tape 430. As shown, the lid holder comprises a surface area which is greater than the lid. The surface of the lid holder on which the lid is placed should show low adhesion to the sealant 230 used (e.g. epoxy resin). This is to ensure that the substrate with the lid can easily be removed from the lid holder after applying and curing the sealant. If any adhesive tape is used to attach the lid to the holder, it should also show low adhesion to the adhesive tape. Alternatively, a vacuum chuck 506 is used to keep the lid in place.

Figure 6:
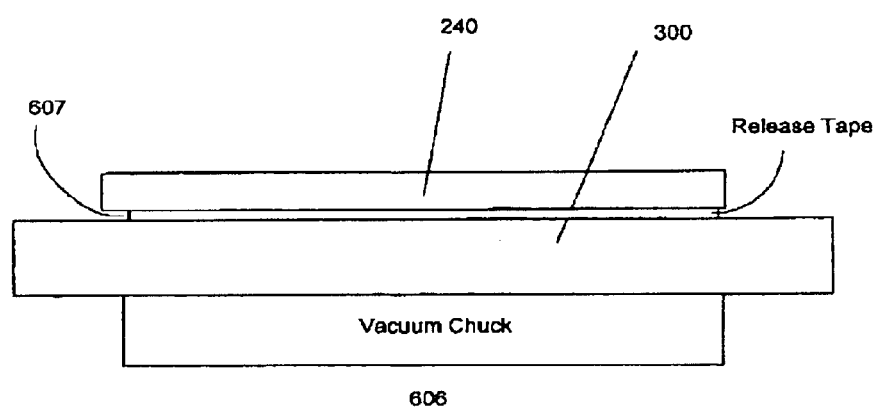

In one embodiment of the invention shown in FIG. 6, the substrate 240 containing the OLED is positioned on the substrate holder 300. As shown, the substrate holder comprises a surface area which is greater than the substrate. The substrate an the substrate holder should be held in place by a vacuum chuck 606, adhesive release tape 607 or mechanical guides.

The rim of the substrate, which is the sealing region, has to be clean before the lid is placed on the substrate. In one embodiment, the substrate undergoes a cleaning treatment along the rim. Cleaning methods include laser cleaning, wet chemical treatment, dry cleaning, mechanical treatment or a combination of all these methods. In another embodiment, the sealing region is protected by masking before or during the sealing procedure.

Figure 7:
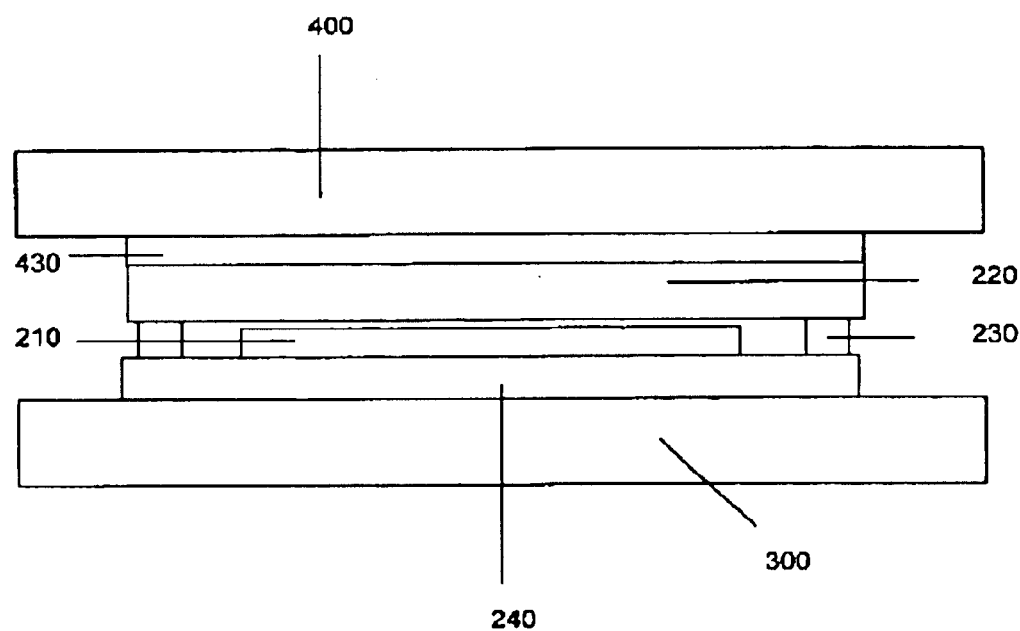

Referring to FIG. 7, the cover lid holder 400 containing the thin flexible lid is aligned with the substrate holder 300 containing the substrate. In one embodiment of the invention, the substrate holder and lid holder contain mechanical guides to ensure precise positioning of the lid holder with respect to the substrate holder. In one embodiment, the substrate holder is positioned on top of the lid holder. Alternatively, the lid holder is positioned on top of the substrate holder.

In one embodiment of the invention, the sealant 230 is dispensed onto the lid before mounting the lid onto the substrate. Alternatively, the sealant is dispensed onto the substrate before mounting. In yet another embodiment, the sealant is dispensed onto the substrate after placing the lid onto the substrate.

After dispensing the sealant, the lid holder and the substrate holder are pressed together to ensure good contact of the lid cover with the substrate. In one embodiment of the invention, the sealant is cured using UV radiation, thus hermetically sealing the OLED device. Alternatively, infrared radiation, heat treatment or a combination of these treatments can be applied to cure the sealant.

If the adhesive tape that is used to attach the substrate or lid to the holders has not lost its adhesion after curing the sealant, the apparatus is placed either on a hot plate, if heat release tape is used, or under a UV lamp, for UV release tape. Alternatively, if other types of special adhesive tape are used, the apparatus is subjected to the treatment that makes the tape lose its adhesive property.

Figure 8:
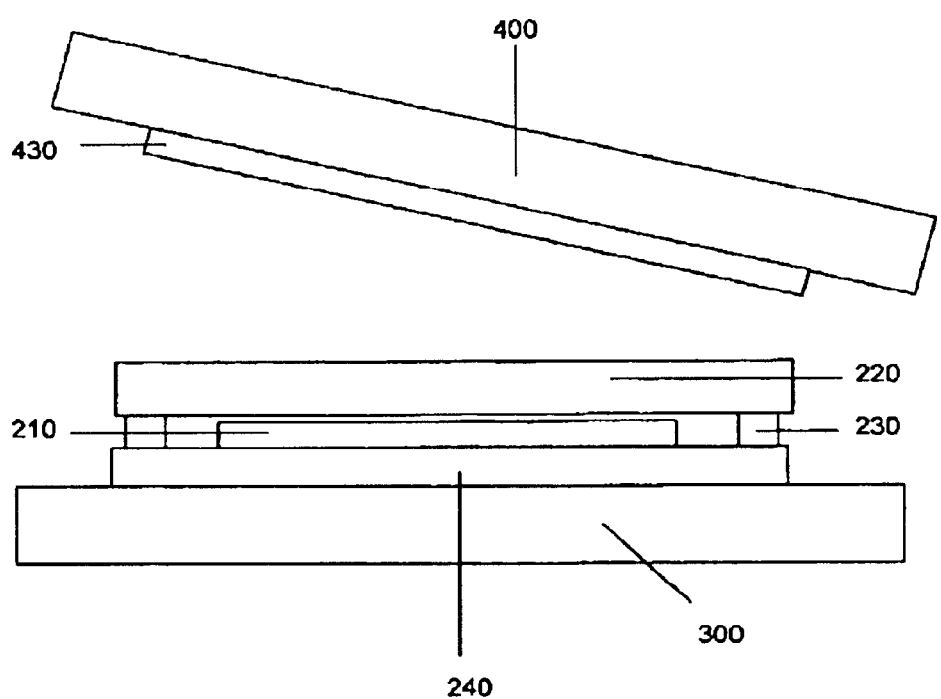

After the treatment, the substrate holder and cover lid holder are separated and the encapsulated device is safely taken out, as shown in FIG. 8, without breaking the lid or the substrate. The present invention is not limited to the processing of a single unit. For example, multiple units which are formed on a single large substrate can be encapsulated in parallel and subsequently separated into individual units. Application of the invention is not limited to a single unit. It is also possible to encapsulate the units before singulation while they are still combined on the mother glass.

EXAMPLE

The OLED is prepared on a thin flexible substrate (50 μm thick, 50 mm×50 mm) using conventional techniques. The substrate is placed on the substrate holder. A flexible cover lid for sealing is attached to the lid holder using heat release tape from Nitto Denko. The flexible lid is 50 μm thick and has dimensions 22 mm by 22 mm. Epoxy resin is dispensed along the perimeter of the lid for sealing. The cover lid is placed onto the substrate by placing the lid holder on top of the substrate holder, positioned by mechanical guides on the substrate and lid holders. An ultraviolet lamp is used to cure the epoxy sealant. The apparatus is then placed on a hotplate at 130 degrees Celsius for 1 minute. The heat release tape loses its adhesion and safely releases the encapsulated OLED device onto the substrate holder.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method for encapsulating a device comprising:
    mounting a substrate on a substrate holder, the substrate includes a device region and a sealing region surrounding the device region;

temporarily mounting a cover lid to a lid holder;

aligning the lid holder with the substrate holder to place the lid on the substrate in preparation for sealing;

sealing the cover lid to the sealing region on the substrate to encapsulate the device; and releasing the cover lid from the lid holder.

2. The method of claim 1 wherein the substrate comprises a flexible substrate.

3. The method of claim 1 wherein the device comprises an OLED device.

4. The method of claim 3 wherein the substrate comprises a flexible substrate.

5. The method of claim 1, 3, or 2 wherein mounting the cover lid to the lid holder comprises mounting the lid with an adhesive release tape or a vacuum chuck.

6. The method of claim 5 wherein aligning comprises moving the substrate holder, moving the lid holder or a combination thereof.

7. The method of claim 5 wherein the substrate holder comprises a surface area greater than a surface area of the substrate and the cover lid holder comprises a surface area greater than a surface area of the cover lid.

8. The method of claim 7 wherein the substrate holder comprises a cavity for aligning the substrate to the substrate holder.

9. The method of claim 8 wherein mounting the substrate to the substrate holder comprises mounting the substrate with an adhesive release tape or a vacuum chuck.

10. The method of claim 9 further comprises performing a release treatment to release the substrate from the substrate holder in which the adhesive tape used to mount the substrate to the substrate holder loses its adhesion and a release treatment to release the cover lid from the lid holder in which the adhesive tape used to mount the cover lid to the lid holder loses its adhesion.

11. The method of claim 7 wherein mounting the substrate to the substrate holder comprises mounting the substrate with an adhesive release tape or a vacuum chuck.

12. The method of claim 11 further comprises performing a release treatment to release the substrate from the substrate holder in which the adhesive tape used to mount the substrate to the substrate holder loses its adhesion and a release treatment to release the cover lid from the lid holder in which the adhesive tape used to mount the cover lid to the lid holder loses its adhesion.

13. The method of claim 5 further comprises performing a release treatment to release the cover lid from the lid holder in which the adhesive tape loses its adhesion.

14. The method of claim 13 wherein the release treatment comprises exposure to heat or UV radiation.

15. The method of claim 14 further comprises performing a cleaning treatment on the sealing region on the substrate prior to sealing the cover lid, wherein performing the cleaning treatment comprises performing laser cleaning, chemical cleaning, dry cleaning, mechanical cleaning or a combination thereof.

16. The method of claim 5 further comprises performing a cleaning treatment on the sealing region on the substrate prior to sealing the cover lid.

17. The method of claim 16 wherein performing the cleaning treatment comprises performing laser cleaning, chemical cleaning, dry cleaning, mechanical cleaning or a combination thereof.

18. The method of claim 7 wherein sealing the lid to the sealing region of the substrate comprises using an adhesive, hot melt adhesive, UV-curable adhesive, thermal curable adhesive, low temperature soldering, ultrasonic bonding, inductance welding or laser welding.

* * * * *

UNITED STATES PATENT AND TRADEMARK OFFICE
CERTIFICATE OF CORRECTION

PATENT NO. : 6,803,245 B2
DATED : October 12, 2004
INVENTOR(S) : Mark Auch, Ewald Guenther and Chua Soo Jin It is certified that error appears in the above-identified patent and that said Letters Patent is hereby corrected as shown below:

<u>Column 5,</u>
Line 13, "1, 3 or 2" should read -- 1, 2, 4 or 5 --.

Signed and Sealed this

Fourth Day of January, 2005

JON W. DUDAS
*Director of the United States Patent and Trademark Office*